(12) United States Patent
Kiermeier et al.

(10) Patent No.: US 7,683,608 B2
(45) Date of Patent: Mar. 23, 2010

(54) HANDLER COMPRISING AN ACCELERATION DEVICE FOR TESTING ELECTRONIC COMPONENTS

(75) Inventors: Arnfried Kiermeier, Oberaufdorf (DE); Michael Klier, Feldkirchen-Westerham (DE); Josef Mühlbauer, Riedering (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 181 days.

(21) Appl. No.: 11/990,748

(22) PCT Filed: May 24, 2007

(86) PCT No.: PCT/EP2007/004644

§ 371 (c)(1),
(2), (4) Date: Feb. 21, 2008

(87) PCT Pub. No.: WO2007/137768

PCT Pub. Date: Dec. 6, 2007

(65) Prior Publication Data

US 2009/0241676 A1 Oct. 1, 2009

(30) Foreign Application Priority Data

May 31, 2006 (DE) .................. 10 2006 025 341

(51) Int. Cl.
*G01R 31/28* (2006.01)
(52) U.S. Cl. ................................... 324/158.1
(58) Field of Classification Search ............. 324/158.1, 324/210, 212, 758; 257/705; 73/119 R, 73/118.1; 364/468.28; 29/825, 603.06, 603.4, 29/603.9; 702/108, 115
See application file for complete search history.

(56) References Cited

U.S. PATENT DOCUMENTS

| 4,499,772 | A |  | 2/1985 | Haas |
| 5,410,261 | A |  | 4/1995 | Hashinaga |
| 5,492,313 | A |  | 2/1996 | Pan et al. |
| 5,777,484 | A |  | 7/1998 | Woith et al. |
| 6,050,556 | A |  | 4/2000 | Masuda et al. |
| 7,505,860 | B2 | * | 3/2009 | Herdendorf et al. ......... 702/108 |
| 7,556,005 | B2 | * | 7/2009 | Tachino et al. ........... 123/90.48 |

FOREIGN PATENT DOCUMENTS

DE 70 15 469 8/1972
EP 0 909 895 A2 4/1999

OTHER PUBLICATIONS

International Search Report for PCT/EP2007/004644 mailed Oct. 29, 2007.

* cited by examiner

*Primary Examiner*—Minh N Tang
*Assistant Examiner*—Trung Q Nguyen
(74) *Attorney, Agent, or Firm*—Nixon & Vanderhye PC

(57) ABSTRACT

The technology herein relates to a handler for testing electronic components, said handler comprising an acceleration device provided with a tappet which is linearly guided by means of at least one flat spring comprising two groups of spring arms, one group being fixed to the tappet and the other group to a frame which is stationary in relation to a housing of the movement generation device. Handler comprising an acceleration device for testing electronic components.

13 Claims, 3 Drawing Sheets

HANDLER COMPRISING AN ACCELERATION DEVICE FOR TESTING ELECTRONIC COMPONENTS

CROSS-REFERENCES TO RELATED APPLICATIONS

This application is the U.S. national phase of International Application No. PCT/EP2007/004644, filed 24 May 2007, which designated the U.S. and claims priority to German Patent Application No. 10 2006 025 341.8, filed 31 May 2006, the entire contents of each of which are hereby incorporated by reference.

STATEMENT REGARDING FEDERALLY SPONSORED RESEARCH OR DEVELOPMENT

N/A

FIELD

The technology herein relates to a handler for testing electronic components comprising a nest to receive the components and an acceleration device, by which the components held in the nest are subjected to acceleration tests, wherein the acceleration device has a tappet, to which the nest can be fixed, as well as a movement generation device for accelerating the tappet in the axial direction.

BACKGROUND AND SUMMARY

As is known, handlers serve to feed electronic components, such as ICs for example, to a test head of a test device, so as to contact the components with the test head and subject these to electrical tests. If the components are to undergo acceleration tests, the component tempered as required is conveyed to a nest, contacted with the test device and accelerated, for example, in perpendicular direction to the contact plane of the component.

In this respect, a device is expressly designated as a handler even if the components are not conveyed to the nest automatically but the nest is loaded by hand.

For this purpose, as is known, the acceleration device comprises a tappet with a free end, to which the nest can be fixed. The tappet is moved to and fro in the axial direction by a movement generation device. The movement generation device can be in the form of a coil, for example, and work according to the loudspeaker principle.

During such acceleration tests the frequencies may vary from the low hertz range to the kilohertz range. The acceleration distance can be a few micrometers up to several centimeters.

Here, there is a problem that, due to the movement generation device, for example a coil, secondary accelerations in unintended spatial directions and also rotary movements can be transmitted to the tappet and thus to the component being tested, as a result of which the measurement results can be distorted. A further problem is that the bearings for linear guidance of the tappet are exposed to extreme loads by the sometimes very high movement frequencies and by temperature ranges of between −55° C. to +155° C., at which these tests are performed. Standard bearings usually do not withstand such loads and do not have the desired durability.

The technology herein relates to a handler of the type initially specified comprising an acceleration device, which with a simple design avoids unwanted secondary accelerations and/or rotations of the tappet and has high durability.

The tappet is linearly guided by means of at least one flat spring, comprising two groups of spring arms, one group being fixed to the tappet and the other group to a frame, which is stationary in relation to a housing of the movement generation device.

By means of such a flat spring the tappet can be prevented from being moved or accelerated in unwanted directions. For example, if the tappet is to be moved to and fro in z-direction, the flat spring prevents the tappet from moving in x and y directions or rotating about its longitudinal axis. Because one group of spring arms is securely fixed to the tappet and the other group to the frame, there are no rolling or sliding movements between the tappet and the flat spring on the one hand and the flat spring and the frame on the other hand, so that unwanted heat generation and wear in these areas can be avoided. The flat spring thus ensures very precise, linear guidance of the tappet in the desired direction with little wear and high durability within a small space.

In accordance with an advantageous embodiment each group has two to six, in particular three to five, spring arms. Particularly preferably in this case, there are three to four spring arms per group, since with such a number on the one hand the tappet is precisely supported in all directions transversely to its longitudinal axis and on the other hand the design of the flat spring can be very simple.

In accordance with an advantageous embodiment the spring arms extend at least substantially radially inwards from a circular closed peripheral area. This permits very compact design of the flat spring. Alternatively, however, in principle the one group of spring arms, which is connected to the tappet, can also extend inwards from the circular closed peripheral area and the other group of spring arms, which is connected to the frame, outwards from the circular closed peripheral area. In addition, all spring arms can also extend outwards, for example if the tappet is in the form of a tube and the flat spring is arranged inside the tappet.

Preferably, the peripheral area is of annular form. Alternatively, however, the peripheral area can also have another form, for example a polygonal form.

Preferably, the spring arms are arranged evenly distributed in the circumferential direction of the flat spring. As a result, uniform application of force onto the flat spring and uniform transmission of power from the tappet to the frame are ensured.

The spring arms can be formed in a straight-line or curved, preferably having an S-shaped curved section in the latter case. While straight-line formation of the spring arms permits very simple and economical production of the flat spring, curved spring arms have the advantage that particularly large deflections are possible within a small space, since the length of the spring arms is increased as a result of the curvature.

The S-shaped curved sections of all spring arms can be arranged in parallel. Alternatively, however, the S-shaped curved sections of one part of the spring arms, preferably half of all spring arms, can also be aligned running counter to the S-shaped curved sections of the other part of the spring arms. As a result, possible torques about the longitudinal axis of the tappet, which are generated by the individual spring arms as the tappet moves to and fro, can cancel each other out.

Preferably, the spring arms are connected to the tappet and the frame at fixing places, which lie on a common circle. As a result, the tappet is supported particularly uniformly on all sides.

In accordance with a further embodiment the tappet is linearly guided by means of at least two axially spaced flat springs. Here, a first flat spring can be arranged adjacent to the nest and at least one further flat spring adjacent to the movement generation device either on the same side as the first flat spring or beyond the movement generation device. The radial support of the tappet by several flat springs permits particularly good linear guidance of the tappet in the desired direction. The arrangement of at least one further flat spring beyond the movement generation device is naturally only possible with acceleration devices in which the tappet passes through the movement generation device and projects over its rear.

BRIEF DESCRIPTION OF THE DRAWINGS

These and other features and advantages will be better and more completely understood by referring to the following detailed description of exemplary non-limiting illustrative implementations in conjunction with the drawings of which.

DETAILED DESCRIPTION OF EXAMPLE NON-LIMITING IMPLEMENTATIONS

Figure 1:
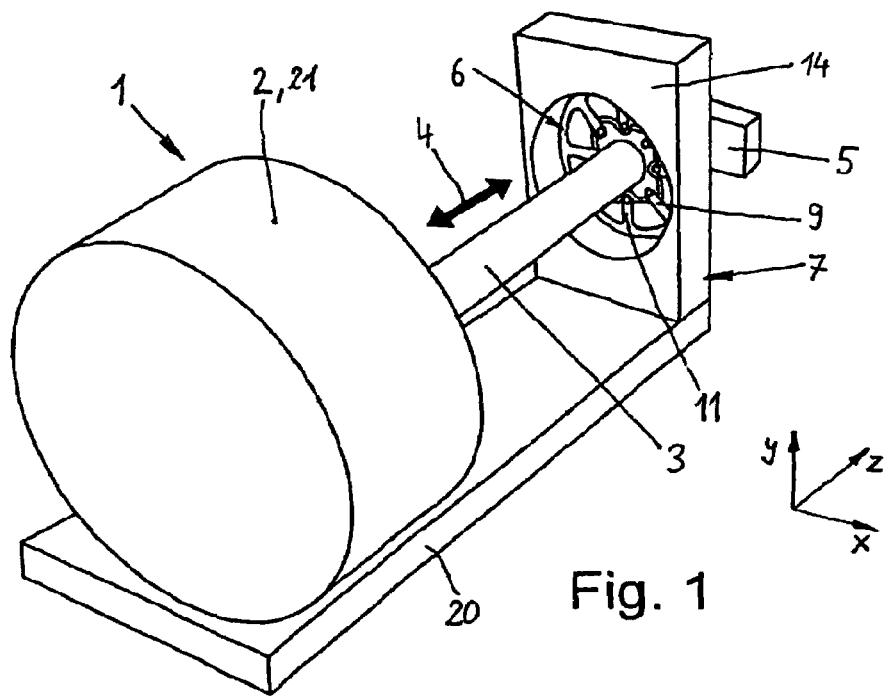
FIG. 1: shows a schematic illustration of an acceleration device for a handler, in order to subject electronic components to acceleration tests.

FIG. 1 shows an acceleration device 1, which is intended to be installed in a handler for electronic components, in order to subject electronic components such as ICs, not illustrated in detail, to an acceleration test.

For this purpose the acceleration device 1 comprises a movement generation device 2, for example a coil, by means of which a tappet 3 can be moved to and fro in the axial direction, that is to say towards the arrow 4, at a certain frequency. The test frequency here depends on the type of component and the desired target application and can amount to a few hertz or several kilohertz. The tappet 3 in the illustrated exemplary embodiment is a straight rod which, for example, has a round cross section but can also have different cross-sectional shapes.

A nest 5, that is to say, a receiving device, in which the component being tested is held, can be fixed to the free end of the tappet 3. When the tappet 3 is moved to and fro towards the arrow, the nest 5 and thus the component are likewise moved accordingly in this direction.

Figure 2:
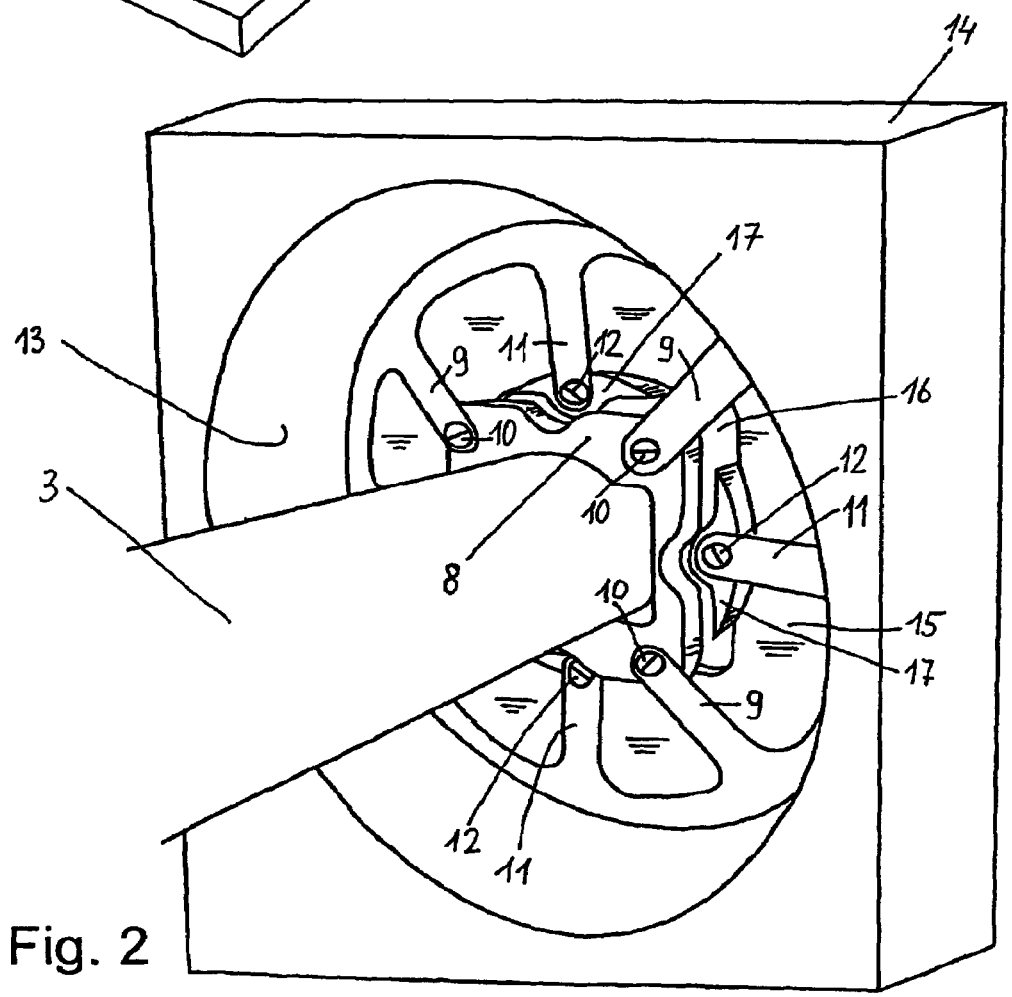
FIG. 2: shows a magnified illustration of the flat spring fixed to the tappet and to a section of the frame.
Figure 3:
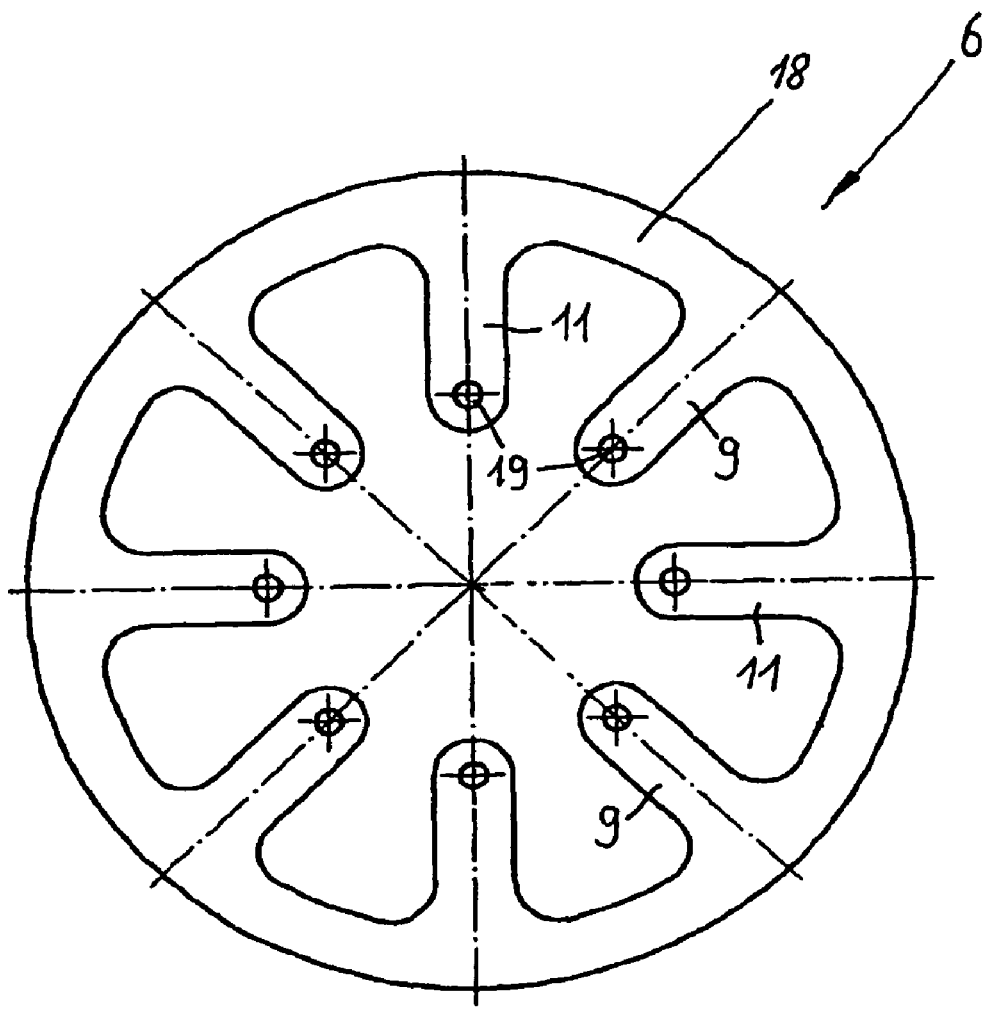
FIG. 3: shows a front view of the flat spring of FIG. 2 in lone position.
Figure 4:
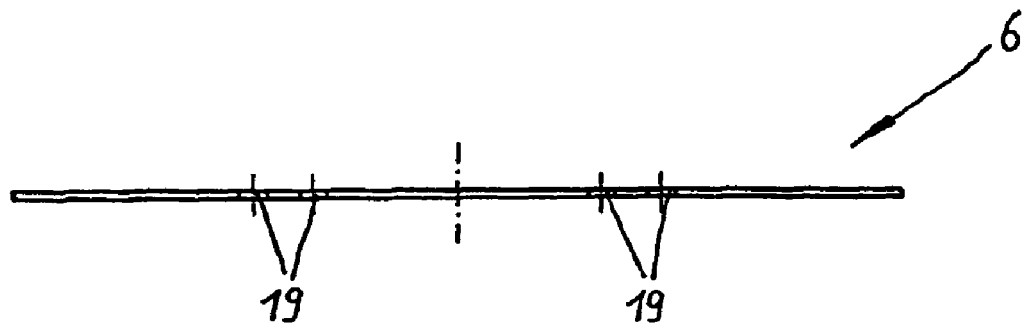
FIG. 4: shows a side view of the flat spring of FIG. 3, FIG. 5: shows a second embodiment of a flat spring.

The tappet 3 is linearly guided on a frame 7 by means of a flat spring 6 illustrated in detail in FIGS. 3 and 4, in such a way that the tappet 3 can only be moved to and fro towards the arrow 4, that is to say in z-direction, while secondary movements, and therefore secondary accelerations transverse to the z-direction, that is to say, in x- or y-direction, as well as rotary movements about the longitudinal axis of the tappet 3, are avoided. For this purpose, the tappet 3 has a mounting flange 8, illustrated in detail in FIG. 2, which is firmly connected to—for example moulded, welded or shrunk onto—the tappet 3.

A group of spring arms 9 of the flat spring 6 is firmly connected to the mounting flange 8, in particular firmly bolted on by means of bolts 10, while another group of spring arms 11 is connected to the frame 7, in particular firmly bolted on by means of bolts 12. Here, the flat spring 6 contacts the frame 7 exclusively by means of the spring arms 11. The flat spring 6, as is evident from FIGS. 1 and 2, is thus inserted in an opening 13 of the frame 7 in such a way that the outer circumference of the flat spring 6 does not touch the inner peripheral wall of the opening 13.

In the exemplary embodiment illustrated the opening 13 has the form of a circular boring, which in z-direction does not completely penetrate a vertical element 14 of the frame 7, so that a wall 15 is formed which extends radially inwards from the peripheral area of the opening 13 and thus creates a shoulder. A centric, axial passage 16, which is formed in such a manner that the tappet 3 together with the mounting flange 8 can pass through, is provided in the wall 15.

As is evident from FIG. 2, four socket-type projections 17, which are arranged in proximity to the passage 16 and jut out over the wall 15 in the axial direction, are provided on the wall 15. The projections 17 are regularly distributed and arranged around the passage 16 at those places, where the inner ends of the spring arms 11 are located. As is evident, the spring arms 11 are fixed to the projections 17 by means of the bolts 12, so that the remaining part of the spring arms 11 extends outwards at a distance from the wall 15. In this way, the spring arms 11 can move outside the projections 17 in the axial direction without bumping against the wall 15.

The inner ends of the spring arms 9 are fixed in the four corner areas of the mounting flange 8.

The flat spring 6 shown in FIGS. 1 and 2 is described below in detail on the basis of FIGS. 3 and 4. The flat spring 6 is in the form of a flat diaphragm spring and has a circular peripheral area 18 with an annular outer contour. Four spring arms 9 and four spring arms 11 extend radially inwards from this peripheral area 18 in a straight-line. The spring arms 9 and the spring arms 11 alternate, seen in circumferential direction, that is to say, a spring arm 11 follows after a spring arm 9 in circumferential direction, then again a spring arm 9 etc. The spring arms 9, 11 are arranged regularly distributed in circumferential direction, that is to say, the longitudinal axes of adjacent spring arms 9, 11 are at an angle of 45° to one another and meet in the center of the flat spring 6 (FIG. 3). The spring arms 9, 11 also have the same length, which is dimensioned so that the inner ends of the spring arms 9, 11 lie on a circle with a diameter which is greater than the outside diameter of the tappet 3. Borings 19 through which the bolts 10, 12 (FIG. 2) can be guided are provided in the internal end areas of the spring arms 9, 11. The borings 19 of all spring arms 9, 11 lie on a concentric circle around the center of the flat spring 6.

The width of the spring arms 9, 11 in the present exemplary embodiment corresponds approximately to the width of the peripheral area 18 but can vary depending on the individual requirements. The diameter of that circle, on which the centers of the borings 19 lie, in the exemplary embodiment of FIG. 3 is about 46% of the outside diameter of the flat spring 6 but can vary widely depending on the requirements. Furthermore, it is not absolutely essential that the spring arms 9, 11 all have the same length. It is also conceivable that the spring arms 9 have a different length to the spring arms 11 or that the spring arms of a group also have a different length to one another.

The function of the flat spring 6 is such that the forces applied by the tappet 3 via the mounting flange 8 onto the spring arms 9 are transmitted via the peripheral area 18 onto the spring arms 11 and from these onto the vertical element 14 of the frame 7. Via the spring arms 9, 11 the tappet 3 is thus supported in the radial direction relative to the frame 7 but at the same time can move to and fro in the axial direction.

The vertical element 14 of the frame 7, as is evident from FIG. 1, is again firmly connected to a horizontal element 20, to which a housing 21 of the movement generation device 2 is fixed.

Figure 5:
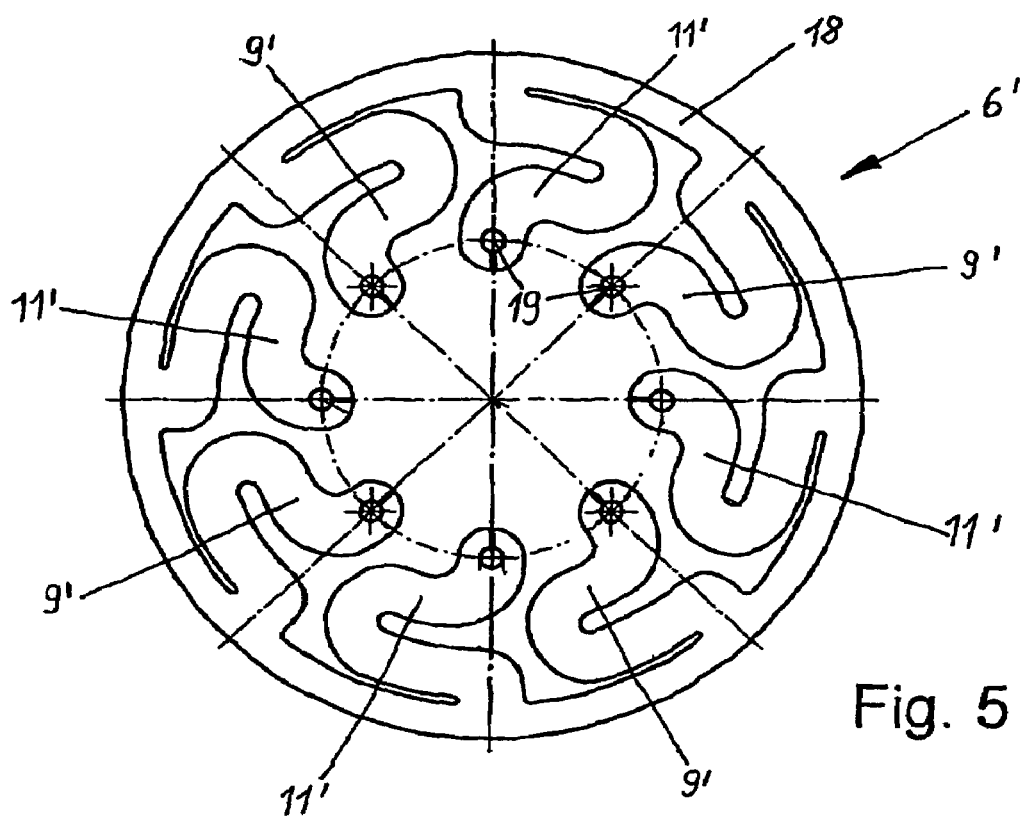

FIG. 5 shows a second embodiment of a flat spring 6', which is basically of a similar form to the flat spring 6, however, in place of straight spring arms 9, 11 it has curved spring arms 9', 11'. The spring arms 9', 11' have an S-shaped curved section or, depending on the side from which the flat spring 6' is seen, a curved section in the form of a mirror-reversed "S". Due to the curved sections the spring arms 9', 11' thus have sections, which extend at least substantially in the circumferential direction of the flat spring 6', as a result of which the length of the spring arms 9', 11' can be increased, although their inner ends lie on a circle having the same diameter as the flat spring 6. This can permit larger deflections in the axial direction of the tappet 3.

Furthermore, it is clear from FIG. 5 that the curved sections of all spring arms 9', 11' are arranged in parallel, that is to say, the curved sections all extend in the same circumferential direction.

Figure 6:
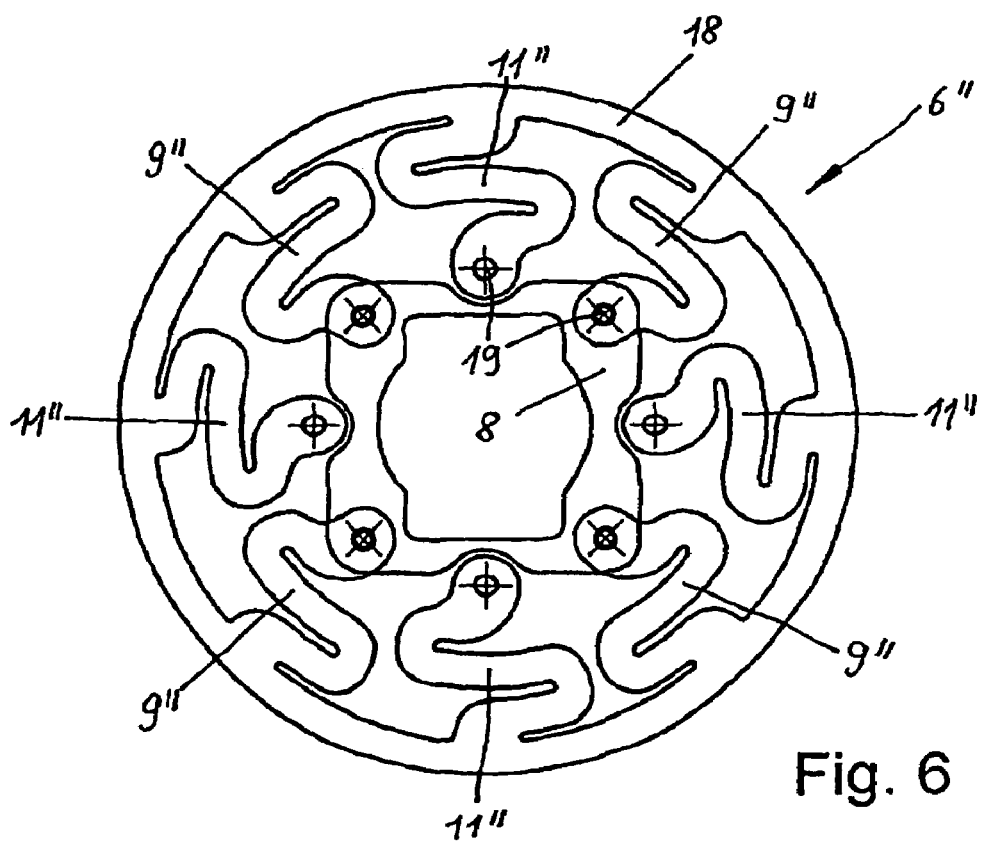
FIG. 6: shows a third embodiment of a flat spring.

FIG. 6 shows a further embodiment variant of a flat spring 6", which is entirely of similar form to the flat spring 6' in FIG. 5 and therefore also has spring arms 9", 11", which curl radially inwards from the peripheral area 18. Here, however, half the curved sections of the spring arms 9" are aligned running counter to the curved sections of the other part of the spring arms 9". In the same way, the curved sections of half the spring arms 11" are aligned running counter to the curved sections of the other part of the spring arms 11". As a result of the counter-running orientation of the curved sections, it is possible here that torques which are generated during an axial movement of the spring arms 9", 11" by these themselves, cancel each other out.

As material for the flat springs 6, 6', 6" the most diverse materials, which withstand the loads arising, for example spring steel or composite glass fiber materials, may be selected. End stops can prevent overstraining of the device in the desired direction of deflection.

The invention claimed is:

1. A handler for testing electronic components comprising a nest to receive the components and an acceleration device, by which components held in the nest are subjected to acceleration tests, wherein the acceleration device has a tappet, to which the nest can be fixed, as well as a movement generation device for accelerating the tappet in the axial direction, wherein the tappet is linearly guided by means of at least one flat spring, comprising two groups of spring arms, one group being fixed to the tappet and the other group to a frame which is stationary in relation to a housing of the movement generation device.

2. The handler as claimed in claim 1, wherein each group comprises two to six, in particular three to five, spring arms.

3. The handler as claimed in claim 1, wherein the spring arms extend at least substantially radially inwards from a circular closed peripheral area.

4. The handler as claimed in claim 3, wherein the peripheral area is of annular form.

5. The handler as claimed in claim 1, wherein the spring arms are arranged evenly distributed in the circumferential direction of the flat spring.

6. The handler as claimed in claim 1, wherein the spring arms are formed in a straight-line.

7. The handler as claimed in claim 1, wherein the spring arms are formed in a curve.

8. The handler as claimed in claim 7, wherein the spring arms have an S-shaped curved section.

9. The handler as claimed in claim 8, wherein the S-shaped curved sections of all spring arms are arranged in parallel.

10. The handler as claimed in claim 8, wherein the S-shaped curved sections of one part of the spring arms, preferably half of all spring arms, are aligned running counter to the S-shaped curved sections of the other part of the spring arms.

11. The handler as claimed in claim 1, wherein the spring arms are connected to the tappet and the frame at fixing places, which lie on a common circle.

12. The handler as claimed in claim 1, wherein the tappet is linearly guided by means of at least two axially spaced flat springs.

13. The handler as claimed in claim 12, wherein at least one first flat spring is arranged adjacent to the nest and at least one further flat spring adjacent to the movement generation device either on the same side as the first flat spring or beyond the movement generation device.

* * * * *